United States Patent
Chong et al.

(10) Patent No.: US 9,524,990 B2
(45) Date of Patent: Dec. 20, 2016

(54) DISPLAY DEVICE

(71) Applicant: Samsung Display Co., Ltd., Yongin (KR)

(72) Inventors: Joong-gun Chong, Yongin (KR); O-Sung Seo, Yongin (KR); Seung-Jun Yu, Yongin (KR); Sang-Myoung Lee, Yongin (KR); Hyoung-Cheol Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/790,338

(22) Filed: Jul. 2, 2015

(65) Prior Publication Data

US 2016/0118410 A1    Apr. 28, 2016

(30) Foreign Application Priority Data

Oct. 28, 2014 (KR) .......................... 10-2014-0147702

(51) Int. Cl.
    *H01L 27/12*    (2006.01)

(52) U.S. Cl.
    CPC .......... *H01L 27/124* (2013.01); *H01L 27/1248* (2013.01)

(58) Field of Classification Search
    CPC .......................... H01L 27/124; H01L 27/1248
    USPC ...................................................... 257/401
    See application file for complete search history.

(56) References Cited

U.S. PATENT DOCUMENTS

| 4,636,825 | A  | * | 1/1987 | Baynes | H01L 29/0843 257/401 |
| 2010/0045586 | A1 | * | 2/2010 | Kim | G02F 1/136213 345/98 |
| 2012/0299887 | A1 | * | 11/2012 | Tanaka | G09G 3/3688 345/204 |

FOREIGN PATENT DOCUMENTS

| KR | 10-2005-0113420 | 12/2005 |
| KR | 10-2006-0001234 | 1/2006 |
| KR | 10-2007-0120324 | 12/2007 |
| KR | 10-2008-0062552 | 7/2008 |

\* cited by examiner

*Primary Examiner* — Fernando L Toledo
*Assistant Examiner* — Adam S Bowen
(74) *Attorney, Agent, or Firm* — H.C. Park & Associates, PLC

(57) ABSTRACT

A display device including: a substrate including first and second sides which face and are parallel to each other, and third and fourth sides which are orthogonal to the first and second sides, and face each other; a gate driver and a data driver disposed along the first side of the substrate; a first diagonal gate line, which is extended in a first direction crossing directions in which the first to fourth sides are extended, and has both ends heading the second and fourth sides of the substrate; a gate pad part extended from one end of the first diagonal gate line adjacent to the second side; an insulation layer including an opening for exposing at least a partial area of the gate pad part and formed on the substrate; a redundancy line extended in a second direction parallel to a direction in which the third and fourth sides are extended, and connected to the gate driver; and a redundancy pad part extended from the redundancy line to be in direct contact with the gate pad part exposed through the opening.

11 Claims, 4 Drawing Sheets

DISPLAY DEVICE

CROSS-REFERENCE TO RELATED APPLICATION

This application claims priority from and the benefit of Korean Patent Application No. 10-2014-0147702, filed on Oct. 28, 2014, which is hereby incorporated by reference for all purposes as if fully set forth herein.

BACKGROUND

Field

Exemplary embodiments relate to a display device.

Discussion of the Background

A display device includes a display panel for displaying an image, and a data driver and a gate driver for driving the display panel. The display panel includes gate lines, data lines, and pixels. Each pixel is connected to a gate line and a data line. The gate line may be extended in a first direction, and the data line may be extended in a second direction orthogonal to the first direction. The data driver outputs a data voltage to the data line, and the gate driver outputs a gate signal for driving the gate line. The data driver may be disposed along one side of the display panel extended in the first direction, and the gate driver may be disposed along another side of the display panel extended in the second direction.

The above information disclosed in this Background section is only for enhancement of understanding of the background of the inventive concept, and, therefore, it may contain information that does not form the prior art that is already known in this country to a person of ordinary skill in the art.

SUMMARY

An exemplary embodiment provides a display device including: a substrate including first and second sides which face and are parallel to each other, and third and fourth sides which are orthogonal to the first and second sides, and face each other; a gate driver and a data driver disposed along the first side of the substrate; a first diagonal gate line, which extends in a first direction between directions in which the first to fourth sides extend, and has one end disposed at the second side of the substrate and a second end disposed at the fourth side of the substrate; a gate pad part extended from the one end of the first diagonal gate line disposed at the second side; an insulation layer including an opening for exposing at least a partial area of the gate pad part and formed on the substrate; a redundancy line extended in a second direction parallel to a direction in which the third and fourth sides extend, and connected at one end to the gate driver; and a redundancy pad part extended from a second end of the redundancy line to be in direct contact with the gate pad part exposed through the opening.

Additional aspects will be set forth in the detailed description which follows, and, in part, will be apparent from the disclosure, or may be learned by practice of the inventive concept.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
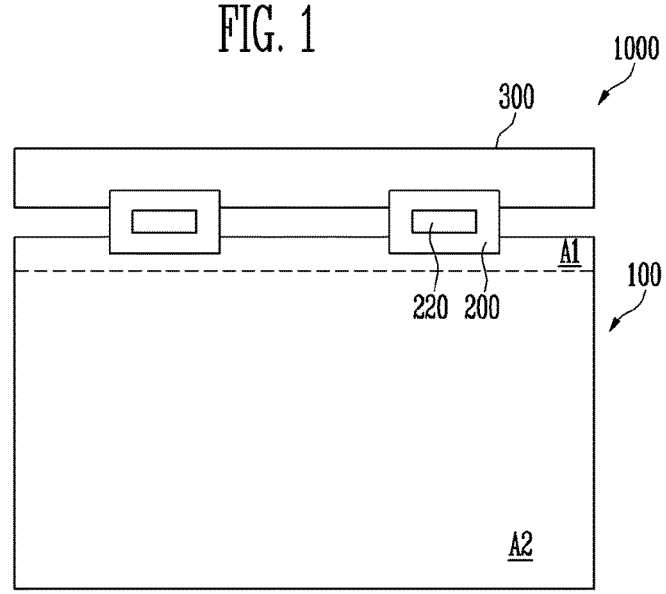
FIG. 1 is a diagram illustrating a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
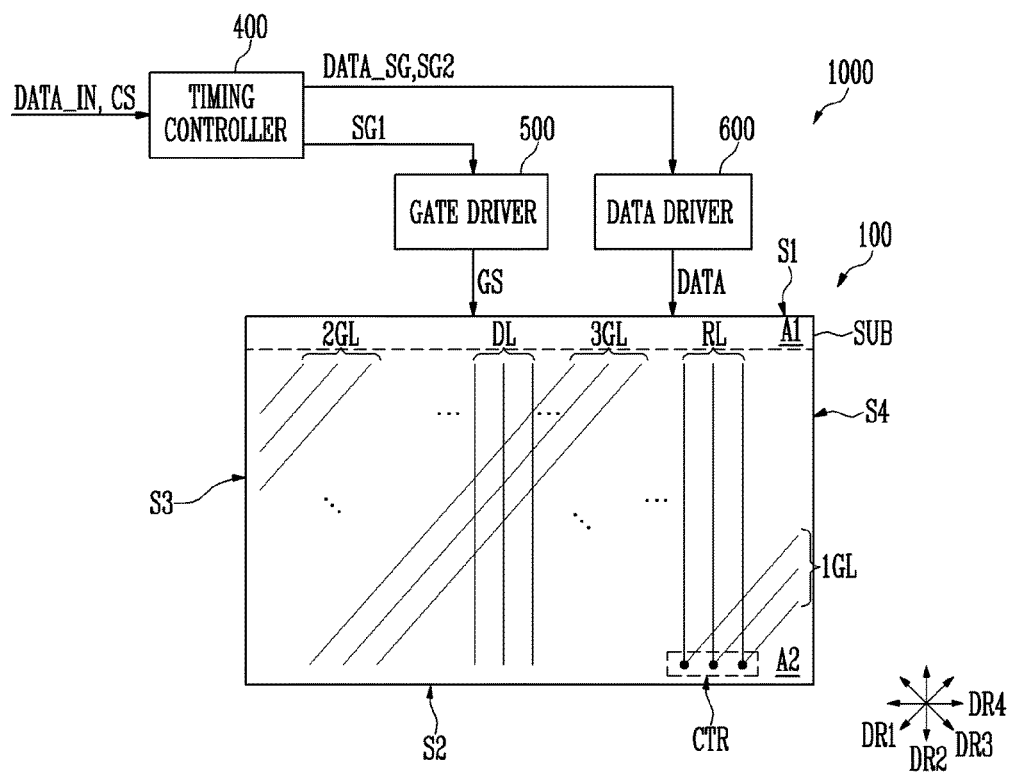
FIG. 2 is a block diagram of the display device illustrated in FIG. 1.

FIG. 1 is a diagram illustrating a display device according to an exemplary embodiment of the present invention. FIG. 2 is a block diagram of the display device illustrated in FIG. 1.

Referring to FIGS. 1 and 2, a display device 1000 may include a display panel 100, a flexible printed circuit board 200, a printed circuit board 300, a timing controller 400, a gate driver 500, and a data driver 600.

The display panel 100 may include various display panels, including, but not limited to, an organic light emitting display panel, a liquid crystal display panel, a plasma display panel, an electrophoretic display panel, and an electrowetting display panel.

The display panel 100 includes a driver connection area A1 and a pixel array area A2. The driver connection area A1 is an area in which an image is not displayed. The driver connection area A1 may include pad parts (not illustrated) connected to partial wires DL, RL, 2GL, and 3GL among the wires of the pixel array area A2. The driver connection area A1 is in contact with any one side of the pixel array area A2, and is not in contact with the remaining sides. The pixel array area A2 is an area in which pixels for displaying an image are disposed, and includes wires DL, RL, 1GL, 2GL, and 3GL for supplying signals to the pixels.

The pad parts (not illustrated) and the wires DL, RL, 1GL, 2GL, and 3GL are formed on a substrate SUB of the display panel 100. The substrate SUB may be formed as a quadrilateral having four sides. More particularly, the substrate SUB includes first and second sides S1 and S2, which face and are parallel to each other, and third and fourth sides S3 and S4, which are orthogonal to the first and second sides S1 and S2, face each other, and are parallel to each other. The driver connection area A1 is disposed along the first side S1 while being in contact with the first side S1. Hereinafter, a direction extending between the directions in which the first to fourth sides S1 to S4 are extended is defined as a first direction DR1, and a direction parallel to a direction in which the third and fourth sides S3 and S4 are extended is defined as a second direction DR2. The first direction DR1 is a direction parallel to a diagonal direction of the display panel 100.

The wires DL, RL, 1GL, 2GL, and 3GL of the pixel array area A2 may be divided into data lines DL, diagonal gate lines 1GL, 2GL, and 3GL, and redundancy lines RL. The diagonal gate lines 1GL, 2GL, and 3GL may be divided into first diagonal gate lines 1GL, second diagonal gate lines 2GL, and third diagonal gate lines 3GL. The pixel array area A2 may further include a contact region CTR on which patterns for connecting the redundancy lines RL and the first diagonal gate lines 1GL are formed. The contact region CTR is disposed to be adjacent to the second side S2 of the substrate SUB. The patterns of the contact region CTR will be described below with reference to FIGS. 4A, 4B, 4C, 5, 6, and 7.

The diagonal gate lines 1GL, 2GL, and 3GL are extended in the first direction DR1, spaced apart from each other in a third direction DR3 crossing the first direction DR1, formed of the same metal, and arranged on the same layer. An angle between the first direction DR1 and the third direction DR3 may be variously set. FIG. 2 illustrates an example in which the first direction DR1 and the third direction DR3 are perpendicular to each other.

The first diagonal gate lines 1GL have both ends disposed on the second and fourth sides S2 and S4, respectively. According to this arrangement, neither end of the first diagonal gate lines 1GL is disposed at the driver connection area A1. The first diagonal gate lines 1GL are formed with different lengths. More particularly, the lengths of the first diagonal gate lines 1GL are decreased at a corner of the pixel array area A2 positioned in an area in which the second side S2 is in contact with the fourth side S4.

The second diagonal gate lines 2GL have both ends disposed on the first and third sides S1 and S3, respectively. According to this arrangement, one end of each of the second is diagonal gate lines 2GL is disposed at the driver connection area A1. Accordingly, the second diagonal gate lines 2GL may be connected to the gate driver 500 via the pad parts of the driver connection area A1. The second diagonal gate lines 2GL are formed with different lengths. More particularly, the lengths of the second diagonal gate lines 2GL are decreased at a corner of the pixel array area A2 positioned in an area in which the first side S1 is in contact with the third side S3.

The third diagonal gate lines 3GL are disposed between the first diagonal gate lines 1GL and the second diagonal gate lines 2GL, and have both ends disposed at the first and second sides S1 and S2, respectively. According to this arrangement, one end of each of the third diagonal gate lines 3GL is disposed at the driver connection area A1. Accordingly, the third diagonal gate lines 3GL may be connected to the gate driver 500 via the pad parts of the driver connection area A1.

Thus, the diagonal gate lines 1GL, 2GL, and 3GL are extended in the diagonal direction of the display panel 100. The diagonal gate lines 1GL, 2GL, and 3GL may be extended in various shapes, such as a straight shape, a zigzag shape, or a step shape, in the first direction DR1 that is the diagonal direction of the display panel 100.

The data lines DL are extended in the second direction DR2, spaced apart from each other in a fourth direction DR4 parallel to the direction in which the first and second sides S1 and S2 are extended, formed of the same metal, and are arranged on the same layer. The data lines DL are extended in the second direction DR2, and have both ends disposed at the first and second sides S1 and S2, respectively. According to this arrangement, one end of each of the data lines DL is disposed at the driver connection area A1. One end of each of the data lines DL disposed at the driver connection area A1 may be connected to the data driver 600 via the pad parts of the driver connection area A1. The data lines DL is formed on a different layer from that of the diagonal gate lines 1GL, 2GL, and 3GL with an insulation layer interposed therebetween.

The redundancy lines RL are extended in the second direction DR2, spaced apart from each other in the fourth direction DR4, formed of the same metal, and arranged on the same layer. The redundancy lines RL may be spaced apart from the data lines DL, formed of the same metal as that of the data lines DL, and formed on the same layer as that of the data lines DL. In this case, the redundancy lines RL may be formed by the same mask process as that of the data lines DL. The data lines DL are formed of a low resistance conductive material. For example, the data lines DL may be formed in a triple layer structure in which first molybdenum, aluminum, and second molybdenum are stacked. When the redundancy lines RL are formed of the same conductive material as that of the data lines DL, resistance of the redundancy lines RL may also be designed to be low.

The redundancy lines RL are extended in the second direction DR2, so that the redundancy lines RL have both ends disposed at the first and second sides S1 and S2, respectively. According to this arrangement, one end of each of the redundancy lines RL is disposed at the driver connection area A1, and the other end of each of the redundancy lines RL is disposed at the contact region CTR. One end of each of the redundancy lines RL disposed at the driver connection area A1 may be connected to the gate driver 500 via the pad parts of the driver connection area A1. The other end of each of the redundancy lines RL is connected to one end of each of the first diagonal gate lines 1GL adjacent to the second side S2 via the contact region CTR.

As described above, the second and third diagonal gate lines 2GL and 3GL include one ends disposed at the driver connection area A1 to be connected to the gate driver 500 via only the driver connection area A1. Neither end of each of the first diagonal gate lines 1GL is disposed at the driver connection area A1. The first diagonal gate lines 1GL may be connected to the driver connection area A1 and the gate driver 500 via the redundancy lines RL.

The flexible printed circuit board 200 electrically connects the display panel 100 and the flexible printed circuit board 300. The flexible printed circuit board 200 includes an integrated circuit chip 220. The flexible printed circuit board 200 is electrically connected between the display panel 100 and the printed circuit board 300. The flexible printed circuit board 200 is connected to the driver connection area A1, and more than one flexible printed circuit board 200 may be formed. Although not illustrated, the flexible printed circuit board 200 may be attached onto a rear surface of the display panel 100 in a bent "C" shape.

The printed circuit board 300 may include a plurality of embedded circuit components for driving the display panel 100. The printed circuit board 300 may be attached onto the rear surface of the display panel 100 in a state where the flexible printed circuit board 200 is mounted while being bent.

The timing controller 400 receives an input image signal DATA_IN and a control signal CS from an external graphic controller (not illustrated). The timing controller 400 receives the control signal CS, for example, a vertical synchronization signal, a horizontal synchronization signal, a main clock, and a data enable signal, and generates and outputs a first control signal SG1 and a second control signal SG2. The timing controller 400 converts the input image signal DATA_IN into data signal DATA_SG in accordance with a specification of the data driver 600, and outputs the data signal DATA_SG to the data driver 600.

The first control signal SG1 is a gate control signal for controlling an operation of the gate driver 500. The first control signal SG1 may include a gate clock, an output enable signal, and a vertical initiation signal.

The second control signal SG2 is a data control signal for controlling an operation of the data driver 600. The second control signal SG2 includes a horizontal initiation signal for initiating an operation of the data driver 600, an inverse signal for inverting a polarity of the data voltage, and an output instructing signal for determining a time at which the data voltage is output.

The gate driver 500 generates a gate signal GS based on the first control signal SG1. The gate signal GS may be provided to the second and third diagonal gate lines 2GL and 3GL via the pad parts (not illustrated) formed on the driver connection area A1, or to the first diagonal gate lines 1GL via the pad part and the redundancy lines RL.

The data driver 600 outputs a data voltage DATA converted from the data signal DATA_SG based on the second control signal SG2. The data voltage DATA is applied to the data lines DL via the pad part (not illustrated) formed on the driver connection area A1 of the display panel 100.

The gate driver 500 and the data driver 600 may be formed as one combined integrated circuit chip 220. However, the embodiments are not limited thereto, and the gate driver 500 and the data driver 600 may be formed as separate chips to be embedded in the flexible printed circuit board 200, the printed circuit board 300, or the display panel 100.

The gate driver 500 and the data driver 600 are disposed along the first side S1. The gate driver 500 and the data driver 600 may be connected to the pad parts (not illustrated) of the driver connection area A1. The pad parts are connected to the data lines DL, the redundancy lines RL, and the second and third diagonal gate lines 2GL and 3GL, each of which includes one end disposed at the first side S1.

In an exemplary embodiment of the present invention, the gate driver 500 and the data driver 600 are disposed along one side of the display panel 100. Further, in an exemplary embodiments, the diagonal gate lines 1GL, 2GL, and 3GL are extended in the first direction DR1 that is the diagonal direction of the display panel 100, and the first diagonal gate lines 1GL, which do not have an end disposed at the gate driver 500, among the diagonal gate lines 1GL, 2GL, and 3GL, are connected to the redundancy lines RL that have an end disposed at the gate driver 500. Accordingly, an exemplary embodiment of the present invention may provide a single side driving structure. This allows the other sides to require less area (i.e., for drivers), and thus, be made smaller.

As such, exemplary embodiments may provide a single side driving structure, thereby decreasing decrease an area of a bezel.

Figure 3:
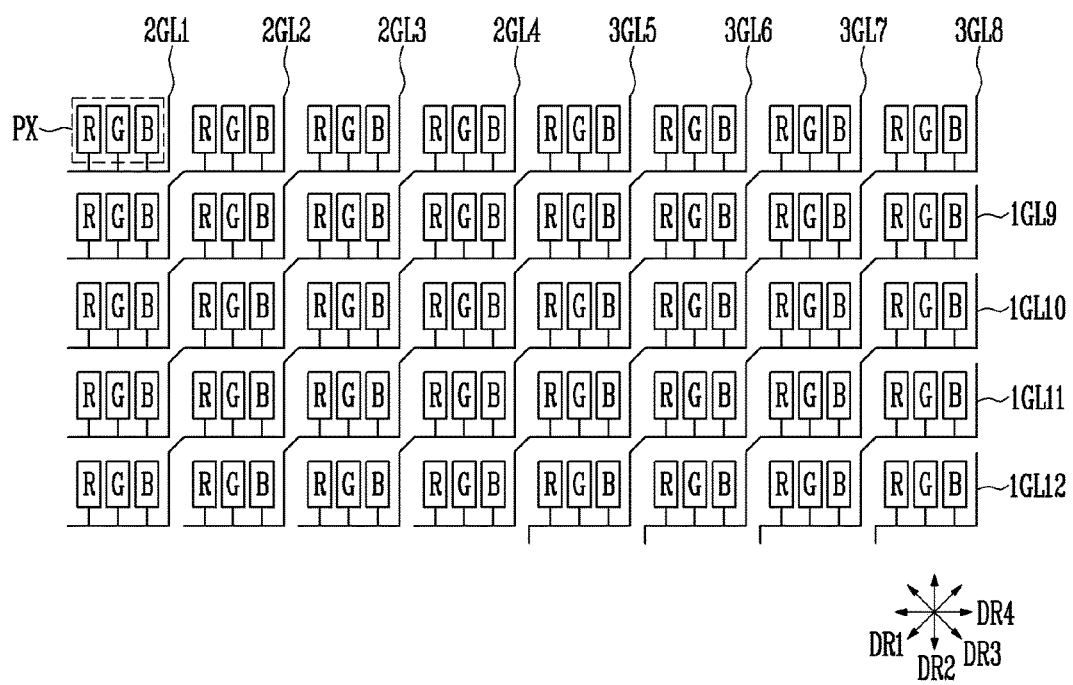
FIG. 3 is a diagram for describing a layout of diagonal gate lines according to an exemplary embodiment of the present invention.

FIG. 3 is a diagram for describing a layout of diagonal gate lines according to an exemplary embodiment.

Referring to FIG. 3, diagonal gate lines 1GL9 to 1GL12, 2GL1 to 2GL4, and 3GL5 to 3GL8 may be connected to the pixels PXs in the unit of a pixel row in the first direction DR1. Each of the pixels PXs may include a red subpixel R, a green subpixel G, and a blue subpixel B. Although not illustrated in the drawings, the data lines DL (see FIG. 2) are connected to the pixels PXs in a pixel column in the second direction DR2. A form of each of the pixels PXs may be defined by a layout of the diagonal gate lines 1GL9 to 1GL12, 2GL1 to 2GL4, and 3GL5 to 3GL8 and the data lines DL (see FIG. 2).

The data lines DL (see FIG. 2) are formed in in straight lines, as illustrated in FIG. 2, and the diagonal gate lines 1GL9 to 1GL12, 2GL1 to 2GL4, and 3GL5 to 3GL8 may be extended in a step form in the first direction DR1 as illustrated in FIG. 3. In this case, each of the pixels PXs may be defined by a quadrilateral parallel to the four sides S1 to S4 of the display panel 100 (see FIG. 2). As a result, it is possible to maximize spaces of the pixels PXs within the display panel 100 (see FIG. 2), thereby improving an aperture ratio of the display panel 100 (see FIG. 2).

Figure 4A:
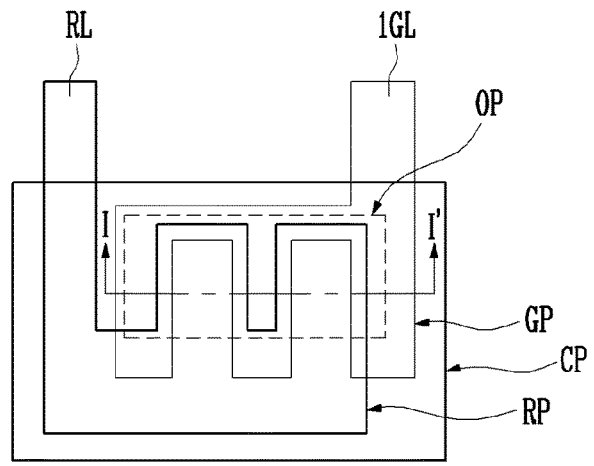
FIGS. 4A, 4B, and 4C are diagrams for describing a layout of patterns in a contact region according to an exemplary embodiment of the present invention.
Figure 4B:
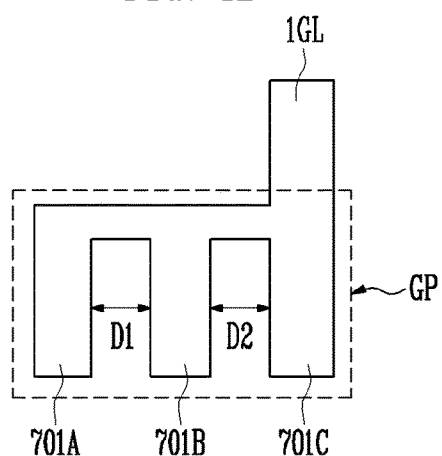
Figure 4C:
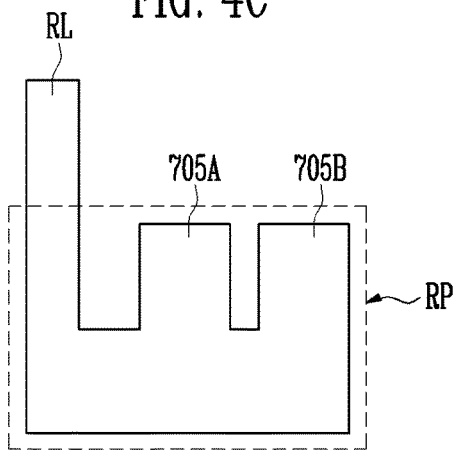
Figure 5:
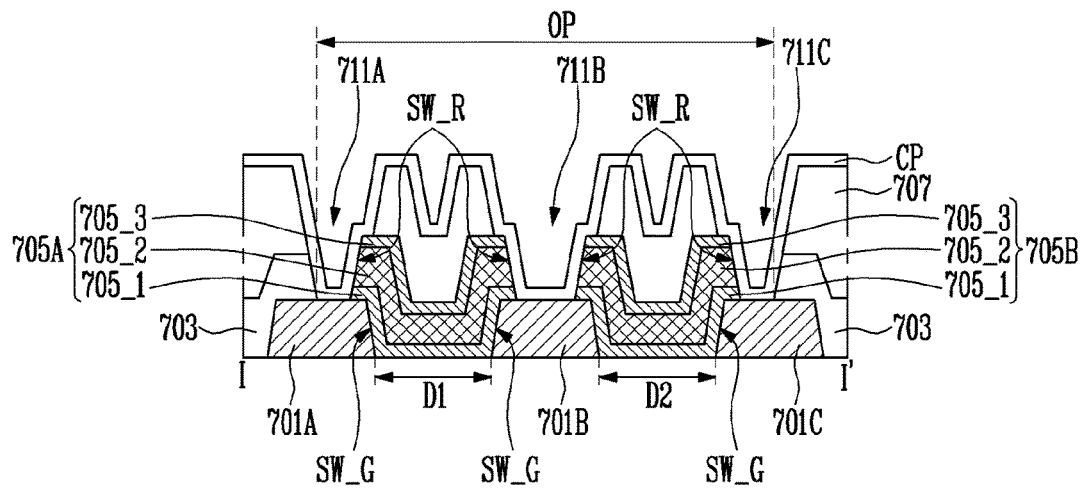
FIG. 5 is a cross-sectional view illustrating patterns of the contact region illustrated in FIG. 4A taken along line I-I'.

FIGS. 4A, 4B, and 4C are diagrams for describing a layout of patterns in a contact region according to an exemplary embodiment. FIG. 5 is a cross-sectional view illustrating patterns of the contact region illustrated in FIG. 4A taken along line I-I'.

Referring to FIGS. 4A, 4B, 4C, and 5, patterns of the contact region CTR include a gate pad part GP and a redundancy pad part RP.

As illustrated in FIG. 4B, the gate pad part GP includes two or more gate branches 701A, 701B, and 701C which are extended from one end of the first diagonal gate line 1GL adjacent to the second side S2 (see FIG. 2) and face each other with spaces D1 and D2 interposed therebetween. The gate pad part GP may be formed in a stack structure of titanium and aluminum, or formed of various metals. The diagonal gate lines described in FIGS. 2 and 3 may be simultaneously formed of the same metal as that of the gate pad part GP.

The gate pad part GP may be covered by an insulation layer 703, as illustrated in FIG. 5. The insulation layer 703 has an opening OP, as illustrated in FIGS. 4A and 5, and is formed on the substrate. The insulation layer 703 may be extended to an upper side of the diagonal gate lines described with reference to FIGS. 2 and 3. The opening OP is disposed so as to expose at least a part of the gate pad part GP. More particularly, the opening OP may be disposed so as to expose lateral walls SW_G of the gate branches 701A, 701B, and 701C. To this end, the opening OP may be disposed to overlap the gate branches 701A, 701B, and 701C and the spaces D1 and D2.

The redundancy pad part RP is formed to be extended from one end of the redundancy line RL adjacent to the second side S2 (see FIG. 2) and be in direct contact with a part of the gate pad part GP exposed through the opening OP. More particularly, the redundancy pad part RP includes one or more redundancy branches 705A and 705B extended from the redundancy line RL to overlap the spaces D1 and D2 between the gate branches 701A, 701B, and 701C. The redundancy branches 705A and 705B may be in contact with the lateral walls SW_G of the gate branches 701A, 701B, and 701C through the opening OP. The redundancy pad part RP including the redundancy branches 705A and 705B may be formed in a triple layer including a first metal layer 705_1, a second metal layer 705_2 formed on the first metal layer 705_1, and a third metal layer 705_3 formed on the second metal layer 705_2, equally to the redundancy line RL. A conductive material of the triple layer is configured to have lower resistance than that of a transparent conductive material, such as an indium tin oxide (ITO) and an indium zinc oxide (IZO). For example, the first metal layer 705_1 and the third metal layer 705_3 may be formed of molybdenum, and the second metal layer 705_2 may be formed of aluminum. As described above, the redundancy branches 705A and 705B having low resistance are in direct contact with the gate branches 701A, 701B, and 701C, thereby decreasing contact resistance between the redundancy pad part RP and the gate pad part GP.

By contrast, when the redundancy pad part RP and the gate pad part GP are connected through a separate pattern without a direct contact, contact resistance between the redundancy pad part RP and the gate pad part GP may increase. When contact resistance between the redundancy pad part RP and the gate pad part GP increases, a voltage drop of the gate signal applied to the first diagonal gate line 1GL increases, so that a deviation between luminance of the pixels connected to the first diagonal gate line 1GL and luminance of the pixels connected to the second and third diagonal gate lines 2GL and 3GL may increase. In an exemplary embodiment, the redundancy pad part RP and the gate pad part GP are in direct contact with each other to decrease contact resistance between the redundancy pad part RP and the gate pad part GP, thereby decreasing a deviation of luminance due to a voltage drop of the gate signal.

In an exemplary embodiment, the gate branches 701A, 701B, and 701C are included with the spaces D1 and D2 interposed therebetween, so that the lateral walls SW_G of the gate branches 701A, 701B, and 701C may be in direct contact with the redundancy branches 705A and 705B of the redundancy pad part RP. By utilizing such a structure, in an exemplary embodiment, a contact region between the redundancy pad part RP and the gate pad part GP increases, thereby further decreasing contact resistance between the redundancy pad part RP and the gate pad part GP.

The redundancy pad part RP including the redundancy branches 705A and 705B may be covered by a passivation layer 707. The passivation layer 707 may be extended to an upper part of the redundancy line RL and the insulation layer 703. The passivation layer 707 may be formed as a nitride layer. The passivation layer 707 may include contact holes 711A, 711B, and 711C for exposing the gate branches 701A, 701B, and 701C, respectively.

A contact pad CP for connecting the lateral walls SW_R of the redundancy branches 705A and 705B and the gate branches 701A, 701B, and 701C may be further formed on the passivation layer 707 including the contact holes 711A, 711B, and 711C. The contact pad CP may be formed of the same material as that of the pixel electrode (not illustrated) to be patterned together with the pixel electrode. In this case, the contact pad CP may be formed of a transparent conductive material, such as an ITO and an IZO.

The contact pad CP connects the lateral wall of the second metal layer 705_2 among the lateral walls SW_R of the redundancy branches 705A and 705B exposed through the contact holes 711A, 711B, and 711C to the gate branches 701A, 701B, and 701C. The redundancy line RL and the redundancy branches 705A and 705B may be formed of a stack structure including the first to third metal layers 705_1 to 705_3 (for example, a stack structure of first molybdenum, aluminum, and second molybdenum) having lower resistance than that of the contact pad CP. In this case, the lateral wall of the second metal layer 705_2 (for example, aluminum) having lower resistance than that of the contact pad CP among the first to third metal layers 705_1 to 705_3 is exposed through the contact holes 711A, 711B, and 711C. The lateral wall of the second metal layer 705_2 may be connected to the gate branches 705A and 705B through the contact pad CP.

The contact pad CP is added as described above, so that a connection path between the gate pad part GP and the redundancy pad part RP may increase. The second metal layer 705_2 of the redundancy pad part RP having low resistance is connected to the gate pad part GP through the contact pad CP, thereby further decreasing contact resistance between the gate pad part GP and the redundancy pad part RP.

Figure 6:
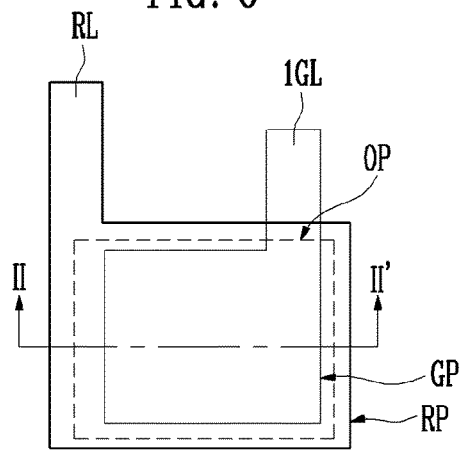
FIG. 6 is a diagram for describing a layout of the patterns of a contact region according to an exemplary embodiment of the present invention.
Figure 7:
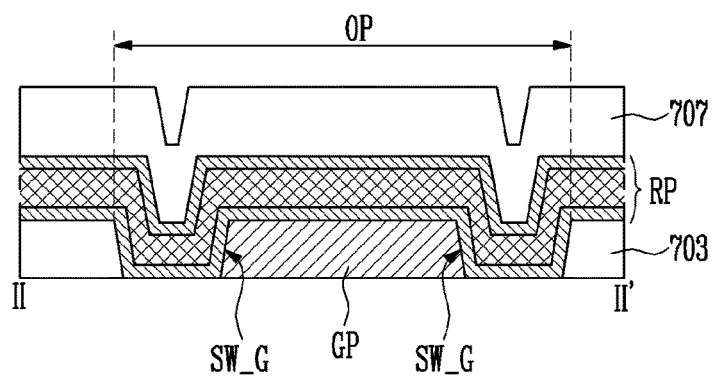
FIG. 7 is a diagram illustrating patterns of the contact region illustrated in FIG. 6 taken along line II-II'.

FIG. 6 is a diagram for describing a layout of patterns of a contact region according to an exemplary embodiment of the present invention. FIG. 7 is a cross-sectional view illustrating patterns of the contact region illustrated in FIG. 6 taken along line II-II'.

Referring to FIGS. 6 and 7, patterns of a contact region include a gate pad part GP and a redundancy pad part RP.

The gate pad part GP may be extended from one end of the first diagonal gate line 1GL adjacent to the second side S2 (see FIG. 2) to be exposed through an opening OP of an insulation layer 703. The gate pad part GP may be formed to have a greater width than that of the first diagonal gate line 1GL.

The opening OP may be formed to be wider than the gate pad part GP to expose the entire lateral wall SW_G of the gate pad part GP and the entire upper surface of the gate pad part GP. The opening OP is disposed so as to overlap the gate pad part GP.

The redundancy pad part RP may be extended from one end of a redundancy line RL adjacent to the second side S2 (see FIG. 2) to be formed with a greater width than that of the redundancy line RL. The redundancy pad part RP is formed to be wider than the gate pad part GP so as to be in directly contact with the entire lateral wall SW_G of the gate pad part GP and the entire upper surface of the gate pad part GP exposed through the opening OP. The redundancy pad part RP may be formed to be wider than the opening OP and fill the opening OP.

The redundancy line RL and the redundancy pad part RP may be formed of the same conductive material as that of the data line DL (see FIG. 2) to have low resistance. In an exemplary embodiment, the redundancy pad part RP of low resistance is in direct contact with the gate pad part GP, thereby decreasing contact resistance between the redundancy pad part RP and the gate pad part GP. In an exemplary embodiment, the redundancy pad part RP is in contact with the entire lateral wall and the entire upper surface of the gate pad part GP, thereby increasing a contact area between the redundancy pad part RP and the gate pad part GP. Accordingly, in an exemplary embodiment, it is possible to further decrease contact resistance between the redundancy pad part RP and the gate pad part GP. In an exemplary embodiment, it is possible to decrease contact resistance between the redundancy pad part RP and the gate pad part GP, thereby decreasing a deviation in luminance due to a voltage drop of a gate signal.

The redundancy line RL and the redundancy pad part RP may be covered by a is passivation layer 707.

By way of summation and review, when the gate driver and the data driver are disposed along different sides of the display panel, an area of a bezel may increase in the display panel. Accordingly, research on minimizing the area of the bezel in the display panel is demanded.

According to an exemplary embodiment, it is possible to dispose the gate driver and the data driver along one side of the display panel. Further, according to an exemplary embodiment, the gate lines are extended in a diagonal direction of the display panel, in such a manner that a redundancy line with one end disposed at the gate driver is connected at the other end to some of the diagonal gate lines which do not have an end disposed at the. gate driver. Accordingly, according to an exemplary embodiment, it is possible to provide a single driving structure.

According to an exemplary embodiment, the redundancy pad part extended from the redundancy line is in direct contact with the gate pad part extended from some of the diagonal gate lines, thereby decreasing contact resistance between the redundancy pad part and the gate pad part. As a result, according to an exemplary embodiment, it is possible to decrease a gate voltage drop.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A display device, comprising:
   a substrate including first and second sides which face and are parallel to each other, and third and fourth sides which are orthogonal to the first and second sides, and face each other;
   a gate driver and a data driver disposed along the first side of the substrate;
   a first diagonal gate line, which extends in a first direction between directions in which the first to fourth sides extend, and has one end disposed at the second side of the substrate and a second end disposed at the fourth side of the substrate;
   a gate pad part extended from the one end of the first diagonal gate line disposed at the second side;
   an insulation layer comprising an opening for exposing at least a partial area of the gate pad part and formed on the substrate;
   a redundancy line extended in a second direction parallel to a direction in which the third and fourth sides extend, and connected at one end to the gate driver; and
   a redundancy pad part extended from a second end of the redundancy line to be in direct contact with the gate pad part exposed through the opening.

2. The display device of claim 1, wherein the gate pad part includes gate branches extended from the first diagonal gate line and facing each other with spaces interposed therebetween.

3. The display device of claim 2, wherein the opening overlaps the gate branches and the spaces to expose lateral walls of the gate branches.

4. The display device of claim 3, wherein the redundancy pad part includes one or more redundancy branches which are extended from the redundancy line and in contact with the lateral walls of the gate branches while overlapping the spaces between the gate branches.

5. The display device of claim 4, further comprising:
a passivation layer covering the redundancy pad part, the redundancy line, and the insulation layer, and comprising contact holes for exposing the gate branches, respectively; and
a contact pad formed on the passivation layer, and connecting the lateral wall of the redundancy branch and the gate branches.

6. The display device of claim 5, wherein the redundancy line and each redundancy branch include a first metal layer, a second metal layer formed on the first metal layer, and a third metal layer formed on the second metal layer, and
the contact pad connects a lateral wall of the second metal layer and the gate branches.

7. The display device of claim 5, wherein the redundancy line and each redundancy branch are formed of a conductive material having lower resistance than that of the contact pad.

8. The display device of claim 7, wherein the redundancy line and each redundancy branch are formed in a triple metal layer in which a first molybdenum layer, an aluminum layer, and a second molybdenum layer are sequentially stacked, and
the contact pad is formed of a transparent conductive material.

9. The display device of claim 1, wherein the opening is formed to be wider than the gate pad part, and
the redundancy pad part is formed to be wider than the gate pad part and fill the opening.

10. The display device of claim 1, further comprising:
a second diagonal gate line extending in the first direction, the second diagonal gate line having a first end disposed at the third side and a second end disposed at the first side so as to be connected to the gate driver;
a third diagonal gate line extending in the first direction and disposed between the first and second diagonal gate lines, the third diagonal gate line having a first end disposed at the second side and a second end disposed at the first side so as to be connected to the gate driver; and
a data line extended in the second direction, and having an end disposed at the first side so as to be connected to the data driver.

11. The display device of claim 10, wherein the data line, the redundancy line, and the redundancy pad part are formed of the same metal.

* * * * *